United States Patent
Wang et al.

(10) Patent No.: US 7,235,423 B1
(45) Date of Patent: Jun. 26, 2007

(54) MOLDED MEMORY CARD PRODUCTION USING CARRIER STRIP

(75) Inventors: Kuang-Yu Wang, Saratoga, CA (US); Jim Ni, San Jose, CA (US); Paul Hsueh, Concord, CA (US); Ren-Kang Chiou, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 321 days.

(21) Appl. No.: 10/982,216

(22) Filed: Nov. 5, 2004

(51) Int. Cl.
   *H01L 21/98* (2006.01)

(52) U.S. Cl. .................... 438/107; 438/126; 257/E21.7

(58) Field of Classification Search ............... 438/126
   See application file for complete search history.

(56) References Cited

U.S. PATENT DOCUMENTS

| | | | |
|---|---|---|---|
| 5,563,769 A | 10/1996 | MacGregor | |
| 5,891,483 A | 4/1999 | Miyajima | |
| 6,040,622 A | 3/2000 | Wallace | |
| 6,102,743 A | 8/2000 | Haffenden et al. | |
| 6,114,189 A * | 9/2000 | Chia et al. | 438/112 |
| 6,166,913 A | 12/2000 | Fun et al. | |
| D445,096 S | 7/2001 | Wallace | |
| 6,323,064 B1 * | 11/2001 | Lee et al. | 438/117 |
| D452,690 S | 1/2002 | Wallace et al. | |
| D452,865 S | 1/2002 | Wallace et al. | |
| D453,934 S | 2/2002 | Wallace et al. | |
| 6,381,143 B1 | 4/2002 | Nakamura | |
| 6,399,906 B1 | 6/2002 | Sato et al. | |
| 6,410,355 B1 | 6/2002 | Wallace | |
| 6,462,273 B1 | 10/2002 | Corisis et al. | |
| 6,527,188 B1 | 3/2003 | Shobara et al. | |
| 6,624,005 B1 | 9/2003 | DiCaprio et al. | |
| 6,634,561 B1 | 10/2003 | Wallace | |
| 2002/0186549 A1 * | 12/2002 | Bolken | 361/737 |
| 2004/0175866 A1 * | 9/2004 | Woerz et al. | 438/127 |
| 2004/0245674 A1 * | 12/2004 | Yew et al. | 264/272.17 |
| 2006/0220202 A1 * | 10/2006 | Osako et al. | 257/679 |

\* cited by examiner

*Primary Examiner*—Stephen W. Smoot
(74) *Attorney, Agent, or Firm*—Bever, Hoffman & Harms, LLP; Patrick T. Bever

(57) ABSTRACT

Plastic casings are simultaneously molded onto several PCBAs attached to a carrier in a closely-spaced arrangement. All edges of each PCBA have integral connecting segments that extend through grooves formed in the associated mold assembly, and are pinched when the molds assembly is closed to precisely and reliably position the PCBA inside of an associated cavity during the molding process. In one embodiment, the PCB substrate is positioned in a bent arrangement to accommodate the use of inexpensive memory devices. Write-protect switches are provided.

19 Claims, 10 Drawing Sheets

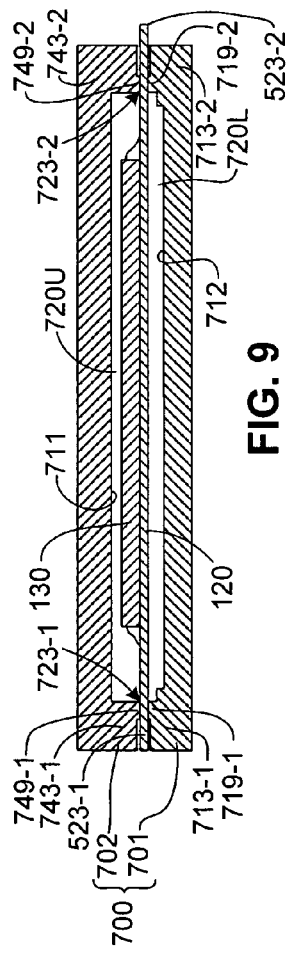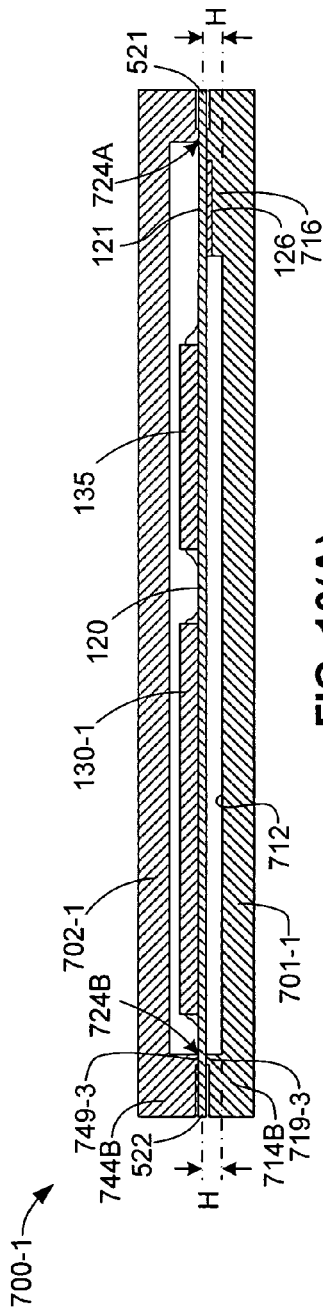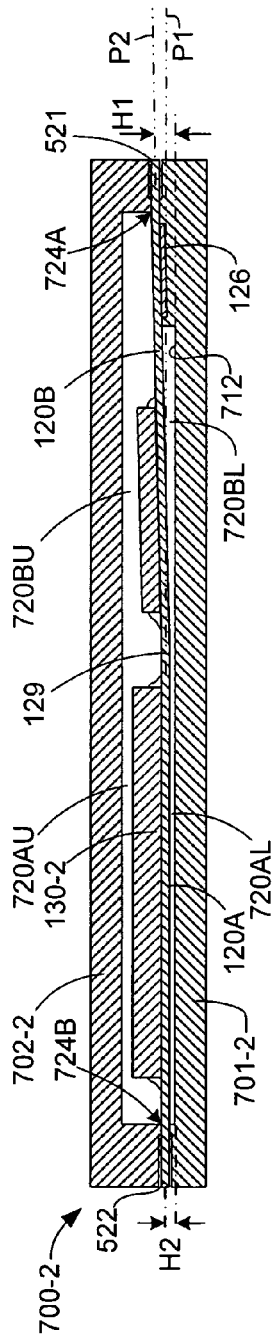

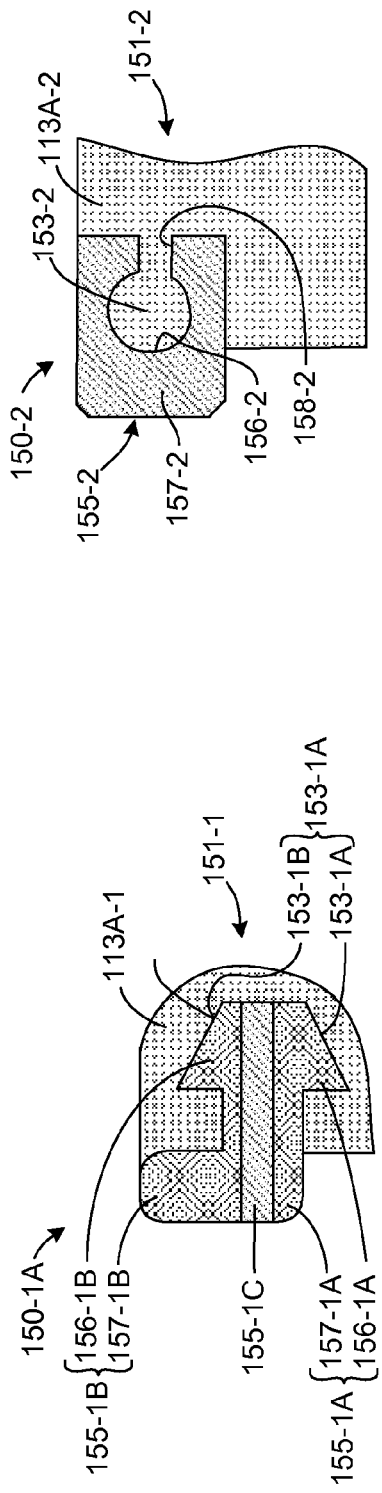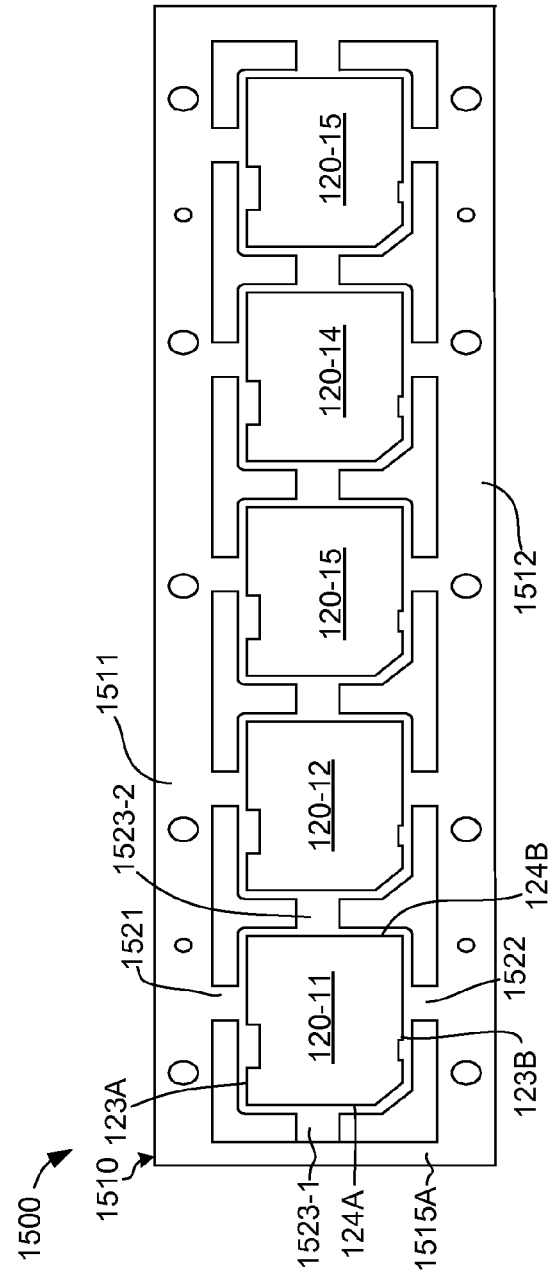

MOLDED MEMORY CARD PRODUCTION USING CARRIER STRIP

BACKGROUND OF THE INVENTION

1. Field of the Invention

The invention relates to the field of electronic devices, and in particular, to a method and structure for accurately and neatly assembling a memory card-type electronic apparatus.

2. Related Art

Memory cards are widely used, for example, for storing digital pictures captured by digital cameras. One useful format is the Secure-Digital (SD) format, which is an extension of the earlier MultiMediaCard (MMC) format. These and other similar card-like structures are collectively referred to herein as "memory cards". Such memory cards are also useful as add-on memory cards for other devices, such as portable music players, personal digital assistants (PDAs), and even notebook computers. SD cards are hot-swappable, allowing the user to easily insert and remove SD cards without rebooting or cycling power. Since the SD cards are small, durable, and removable, data files can easily be transported among electronic devices by being copied to an SD card. SD cards are not limited to flash-memory cards, but other applications such as communications transceivers can be implemented as SD cards.

An important aspect of most memory card structures is that they meet size specifications for a given memory card type. In particular, the size of the casing or housing, and more particularly the width and thickness (height) of the casing/housing, must be precisely formed so that the memory card can be received within a corresponding slot (or other docking structure) formed on an associated card-hosting device. For example, using the SD card specifications mentioned above, each SD card must meet the specified 24 mm width and 2.1 mm thickness specifications in order to be usable in devices that support this SD card type. That is, if the width/thickness specifications of a memory card are too small or too large, then the card can either fail to make the necessary contact pad-to-card-hosting device connections, or fail to fit within the corresponding slot of the associated card-hosting device.

One conventional method for manufacturing memory cards that meet required size specifications includes using a cover or housing that is typically adhesively attached to the PCBA substrate over the semiconductor components. One shortcoming of this approach is that the thickness of such covers is necessarily relatively thick, and therefore takes up a significant amount of the specified memory card thickness (e.g., the 2.1 mm thickness of standard SD cards). As a result, the choice of memory device and other components mounted used in these memory cards is limited to devices that are relatively thin. In addition, because such covers are fabricated separately and then attached to the substrate using an adhesive, the use of such separate covers increases production and assembly costs, and the covers can become detached from the substrate. Another conventional method for manufacturing memory cards is to ultrasonically bond the upper and lower portions of the card assembly. However, tiny bond structures must be precisely made on adjoining portions and thus increases manufacturing cost. In either method mentioned above, there is always a concern about the quality of the bonding, and the joining seam between the two portions is typically the weakest area of the final assembly and is subject to premature separation, resulting in damages to the memory cards.

U.S. Pat. No. 6,462,273 discloses a second conventional memory card fabrication process that avoids the thickness problems associated with separate cover structures by forming a molded casing over the PCBA components. First, the PCBA is assembled using normal practices by forming individual module substrates that are connected to a common carrier by connecting segments, with the material used for the carrier and connecting segments being the same as that of the module substrate. Each module substrate is attached along its side to the carrier substrate by way of the connecting segments, with wide carrier segments of the carrier substrate between located between each adjacent pair of module substrates. During a subsequent plastic molding process, round shaped rods are utilized for forming notches on the card body at locations where the card body remains connected to the carrier by way of the connecting segments. Later, round shape cutters are used for cutting the connecting segments through the notched areas, thereby separating the molded memory cards from the carrier.

A problem with the manufacturing method disclosed in U.S. Pat. No. 6,462,273 is that the disclosed carrier impedes the efficient molding of several memory cards during a single molding cycle (i.e., simultaneously injecting plastic into several cavities of a multi-cavity mold) due to the large support sections separating adjacent card bodies. That is, each molding cavity of a multi-cavity mold assembly must be spaced apart by a distance corresponding to the wide carrier segments located between adjacent module substrates. This intervening space both increases tooling costs by requiring a larger mold, and decreases production efficiency by limiting the number of cavities that a given molding apparatus can support. Furthermore, handling of the small substrate wherein electronic components are mounted adds to the complication of manufacturing and substantially lowers the yield rate.

What is needed is a secured card-type electronic apparatus housing and assembly method that enables high production throughput by way of cost-efficient molding techniques that avoid the problems associated with conventional production methods.

SUMMARY OF THE INVENTION

The present invention is directed to a method for manufacturing memory cards in which plastic casing portions are simultaneously molded onto upper and lower surfaces of several printed circuit board assemblies (PCBAs) that are attached to a carrier in a closely-spaced arrangement such that the number of memory cards produced during each molding cycle is maximized. The carrier includes parallel carrier strips and a row of substantially rectangular printed circuit boards (PCBs) that are connected between the carrier strips and to each other by connecting segments that extend perpendicular to the four edges of each PCB. For example, the front and rear edges of each PCB are connected by first and second connecting segments to the first and second carrier strips, respectively, with the first and second connecting segments extending perpendicular to the parallel carrier strips, and at least one side edge of each PCB are connected to an adjacent PCB by third connecting segments that extends parallel to the carrier strips. Alternatively, the side edges of each PCB are connected by the first and second connecting segments to the first and second carrier strips, and the front and rear edges are connected to an adjacent PCB (or an optional end strip) by the third connecting segments. When mounted into the mold assembly, each PCBA is received in an associated mold cavity such that gaps are provided around the peripheral edge of each PCB, and the connecting segments extend through grooves formed in the peripheral wall surrounding the associated mold cavity. By minimizing the length of the third connecting segments separating adjacent PCBAs, the mold-cavities of the mold assembly are spaced in a highly efficient mold cavity arrangement, thereby maximizing the number of memory cards produced during each molding cycle. The carrier strips include indexing holes that facilitate accurate positioning within the mold assembly. The mold assembly is formed such that when the upper mold portion is closed onto the lower mold portion, the connecting segments are pinched (held) such that each PCBA is suspending within an associated mold cavity, and such that cavity spaces are formed both above and below the PCBA. Molten thermoplastic material is then injected into each cavity of the mold assembly under heat and pressure using known injection molding techniques, thereby forming molded plastic casing portions on the upper and lower surfaces of each PCBA, with the lower casing portion including windows that expose metal contact pads formed on the PCBA. The carrier is then removed from the mold assembly, and the completed memory cards are singulated by cropping the connecting segments extending from the side and end walls of each memory card casing.

According to another embodiment of the present invention, the method involves bending each PCBA inside the mold assembly such that a rear section of the PCBA is maintained parallel with a lower surface of the associated cavity, and a front section of the PCBA is maintained at a slight angle relative to the rear section. This embodiment facilitates the production of SD-type memory cards using less expensive Thin Small Outline Package (TSOP)-type flash memory devices while maintaining the contact pads located at the front edge of the PCB at the 0.7 mm height required by SD specifications. Without such a bend, a more expensive Very Very Thin Small Outline Package (WSOP)-type of flash memory will have to be used.

According to another embodiment of the present invention, the method involves attaching the movable portion of a switch onto a molded fixed portion (i.e., a rail or groove) that is formed along one side wall of the memory card casing. In one specific embodiment, a three-piece movable insert is mounted into the mold cavity prior to molding, so a cavity is formed on the sidewall of the housing after molding. The insert includes upper and lower members and a shim.

The invention will be more fully understood in view of the following description of the exemplary embodiments and the drawings thereof.

BRIEF DESCRIPTION OF THE DRAWINGS

FIG. 9 is a cross-sectional end view showing the carrier of FIG. 5(A) being mounted into the mold assembly of FIG. 7(A);

FIGS. 10(A) and 10(B) are cross-sectional side views depicting the carrier of FIG. 5(A) being mounted into mold assembly according to alternative embodiments of the present invention;

FIG. 13 is a cross-sectional side view showing a switch structure according to an embodiment of the present invention;

FIG. 14 is a cross-sectional side view showing a switch structure according to an alternative embodiment of the present invention; and FIG. 15 is a top view showing a substrate carrier utilized in the production of memory cards according to an alternative embodiment of the present invention.

DETAILED DESCRIPTION

The present invention is directed to portable computer peripheral devices, and in particular to low-cost memory cards that are connected to host systems (e.g., digital cameras) to perform various functions. While the present invention is depicted in particular as a SD-type memory card, it should be appreciated that the present invention is applicable to any and all similarly constructed memory devices. The term "host system" is used herein to refer to any electronic computer of any type or size including, but not limited to, desktop computers, notebook computers, palmtop computers and personal digital assistant (PDA) devices. Positional terms such as "front", "back", "upper", and "lower" are used for descriptive purposes in the description below and in the claims, and are intended only to describe relative positions of the recited parts, and are not intended to be limited to positions based on a fixed external reference.

Figure 1A:
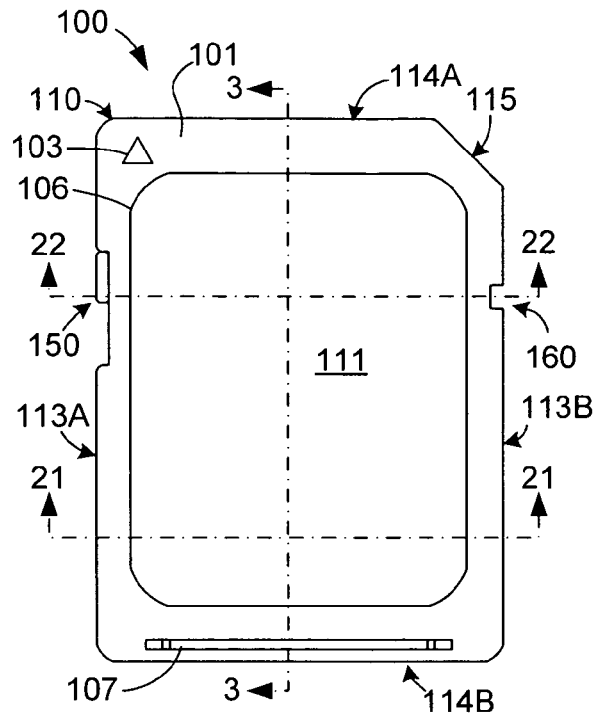
FIGS. 1(A), 1(B) and 1(C) are top, bottom, and side views of a memory card produced in accordance with an embodiment of the present invention.
Figure 1B:
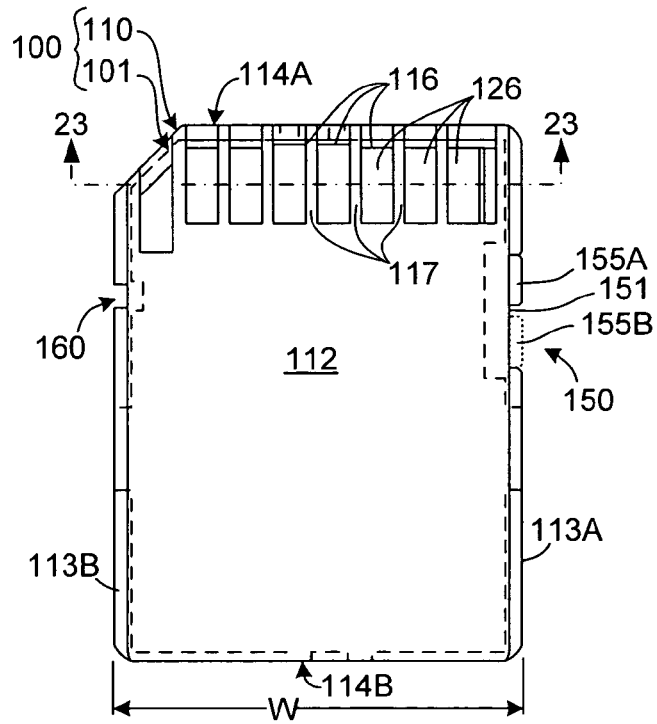
Figure 1C:
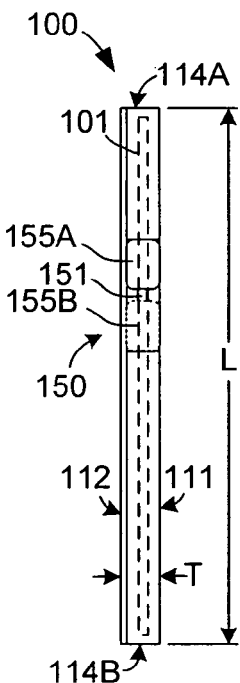

FIGS. 1(A), 1(B), and 1(C) are top, bottom, and side views, respectively, showing an exemplary SD-type memory card 100 constructed in accordance with the present invention. Memory card 100 is also shown in various cross-sectional views in FIGS. 2(A), 2(B), and 2(C).

Referring to FIG. 1(B), memory card 100 generally includes a printed circuit board assembly (PCBA) 101 (indicated by dashed line) encased within a molded plastic casing 110. Plastic casing 110 includes an upper wall 111 (FIG. 1(A)) and a lower wall 112 that are formed on respective upper and lower surfaces of PCBA 101 in the manner described below. Casing 110 also includes opposing side walls 113A and 113B, and opposing front and back walls 114A and 114B, respectively, that extend between upper wall 111 and lower wall 112 substantially around the entire periphery of casing 110. A chamfer 115 (FIG. 1(A)) is formed between front wall 114A and side wall 113B, and facilitates correct insertion of memory card 100 into a card-hosting device by preventing insertion with the lower side facing upward (i.e., the card-hosting device is constructed such that the full insertion of memory card 100 requires the proper orientation of chamfer 115). Lower wall 112 defines several windows 116, which are separated by ribs 117, that expose contact pads 126 of PCBA 101 in the manner described below. In the left upper corner (FIG. 1(A)), a triangular insertion direction mark 103 is provided for indicating the proper card insertion direction, and an optional identification label 106 is affixed in a central region of the upper surface. An optional feature 107 is provided adjacent to back wall 114B to facilitate manual insertion and removal of memory card 100 from a card-hosting device. Typically this feature is designed in the form of a long, narrow ditch or ridge.

As indicated in FIGS. 1(B) and 1(C), memory card 100 has a width W measured between side walls 113A and 113B of casing 110, a length L measured between front wall 114A and back wall 114B, and a thickness T measured between an uppermost surface of upper wall 111 and a lowermost surface of lower wall 112. Note that, of these specifications, the width W and the thickness T are the most critical, particularly adjacent to front wall 114A, because variance of the width and thickness may alter the position of the memory card in a card-hosting device, or prevent insertion altogether (i.e., if the width W and/or thickness T are too large, thereby preventing insertion of the memory card into a corresponding receiving slot provided on the card-hosting device).

Referring to FIGS. 1(A) through 1(C), according to an aspect of the present invention, memory card 100 also includes a write-protect switch structure 150 and an optional notch 160 exposed through openings defined on side walls 113A and 113B of casing 110. As indicated in FIGS. 1(B) and 1(C), switch structure 150 includes a base (fixed) portion 151 that is defined by a portion of molded casing 110 located on side wall 113A, and a movable portion 155 that is connected to base portion 151 such that movable portion 155 is selectively movable (e.g., slidable) between a first position (e.g., as indicated in solid lines by portion 155A) and a second position (e.g., as indicated in dashed lines by portion 155B). Switch structure 150 interacts with a host system to actuate (i.e., enable/disable) a write-protection system provided either on memory card 100 or the host system in response to the position of movable portion 155. For example, when movable portion 155 is in the first position 155A, the write-protection system is prevented from writing data onto memory card 100, and when movable portion 155 is in the second position 155B, the write-protection system is enabled to write data onto memory card 100 in accordance with operations of the host system according to known practices. Typically, the position of movable portion 155 is detected by the host system using a sensor according to known techniques, and the detected position is utilized by the host system to control the write-protection system. Switch structures are discussed in detail below.

Figure 2A:
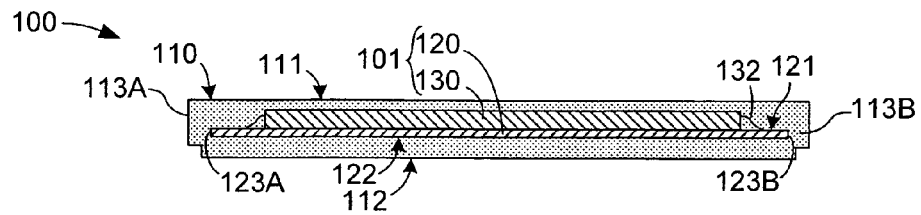
FIGS. 2(A), 2(B) and 2(C) are cross sectional views of the memory card of FIGS. 1(A)–1(C) taken along section lines 21—21, 22—22, and 23—23, respectively, of FIGS. 1(A) and 1(B)
Figure 2B:
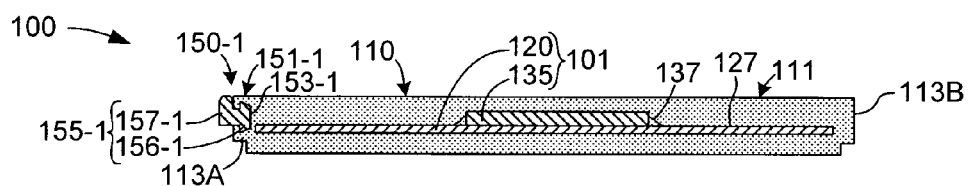
Figure 2C:
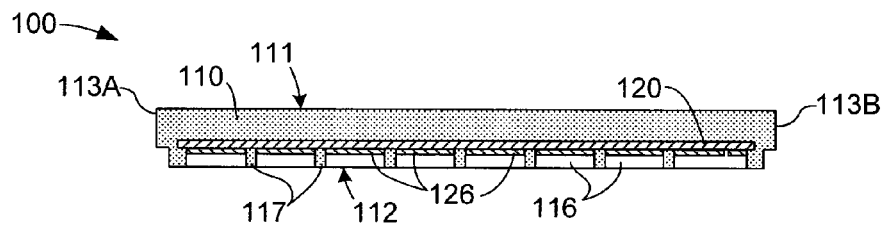

FIGS. 2(A), 2(B), and 2(C) are cross-sectional side views of memory card 100 taken along section lines 21—21, 22—22, 23—23 of FIGS. 1(A) and 1(B), respectively. FIG. 2(A) shows that PCBA 101 includes a printed circuit board (PCB) substrate 120 and a memory device 130 (e.g., a "Flash" memory chip) that is electrically connected to an upper surface 121 of substrate 120, e.g., by bonding wires 132. Upper wall 111 of casing 110 is formed over memory device 130 and upper surface 121 of substrate 120, and lower wall 112 is formed under a lower surface 122 of substrate 120. FIG. 2(B) indicates that PCBA 101 also includes a control circuit 135 that is electrically connected to substrate 120 by bonding wires 137, and is also covered by upper wall 111. Also mounted on substrate 110 are additional electronic components (e.g., capacitors, resisters, and other integrated circuits), which are omitted for illustrative purposes. Finally, FIG. 2(C) shows a cross section taken near the front wall of casing 110 and passing through contact pads 126, and shows ribs 117 separating windows 116, which expose contact pads 126.

In each of the cross-sections shown in FIGS. 2(A), 2(B), and 2(C), side walls 113A and 113B of casing 110 extend over side edges 123A and 123B of substrate 120. In addition, in each of the cross-sections shown in FIGS. 2(A) and 2(B), a portion of casing 110 extends above the upper surface of memory device 130 and control circuit 135. Because the molding process is more accurate and repeatable than the formation of substrate 120, memory card 100 provides a precise and reliable width dimension W and thickness dimension T (see FIGS. 1(B) and 1(C)) by accommodating slight variations in the width/height of substrate 120 and/or components 130 and 135. Further, by forming side walls 113A and 113B of casing 110 such that they extend over side edges 123A and 123B of substrate 120, respectively, memory card 100 provides a structure that resists damage due to delamination of substrate 120 from casing 100. Furthermore, as the substrate an the associated memory devices are surrounded and protected by the plastic after molding, higher reliability about the integrity of the flash memory card can be achieved.

Referring to the left side of FIG. 2(B), a switch structure 150-1, which represents a first specific embodiment of switch structure 150 mentioned above, is shown in additional detail. Switch structure 150-1 includes a base portion 151-1 that is formed by a portion of side wall 113A, and a movable portion 155-1 that is slidably connected to base portion 151-1. In particular, base portion 151-1 defines an elongated channel 153-1 that receives a rail 156-1 formed on movable portion 155-1 such that rail 156-1 is slidably received in channel 153-1. Movable portion 155-1 also includes a handle portion 157-1 that is fixedly connected to rail 156-1 and disposed for manual manipulation.

Figure 3A:
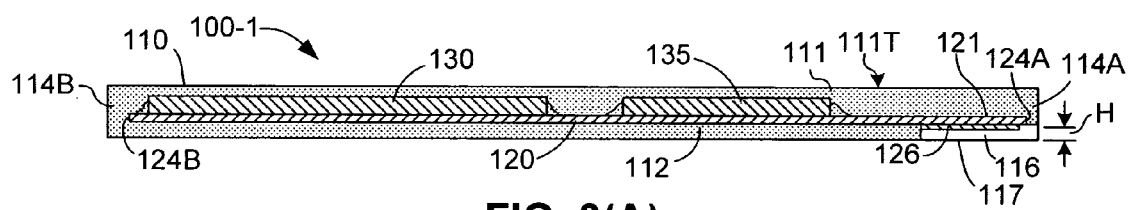
FIGS. 3(A) and 3(B) are cross-sectional views taken along section line 3—3 of FIG. 1(A) showing memory cards produced in accordance with alternative embodiments of the present invention.
Figure 3B:
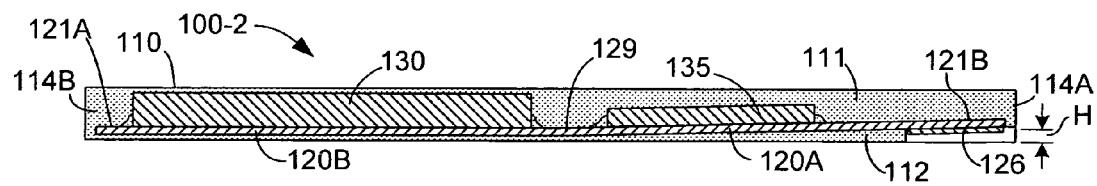

FIGS. 3(A) and 3(B) illustrate alternative cross-sectional views taken along section line 3—3 of FIG. 1(B) (i.e., showing the entire length between front wall 114A and rear wall 114B, which extend over front edge 124A and rear edge 124B of substrate 120). FIG. 3(A) shows a first memory card 100-1 formed in accordance with the first manufacturing method (described below) in which substrate 120 is substantially planar (i.e., such that a distance between upper surface 121 of substrate 120 and an uppermost surface 111T of upper wall 111 is substantially uniform along the entire length of substrate 120). Note that substrate 120 is maintained within housing 110 such that the thickness of lower wall 112 is uniform along the entire length, and contact pads 126 (exposed through windows 116) are maintained at a specified height H of 0.7 mm from a bottom edge of rails 117. Alternatively, FIG. 3(B) illustrates a second memory card 100-2 formed in accordance with the second manufacturing method (described below) in which substrate 120 is bent at a seam 129 such that a rear section 120B located under memory device 130 is substantially planar, as described above, but a front section 120A of substrate 120 is angled slightly upward (i.e., such that a height from upper wall 111 to upper surface of substrate 120 in the portion located over controller device 135 on front section 120A decreases gradually toward front wall 114A, and a height from lower wall 112 to lower surface of substrate 120 in the portion located under front section 120A increases gradually toward front wall 114A). Note that the location of seam 129 and the inclination angle of front section 120A are selected such that contact pads 126 are located at the specified height H. The bent-substrate embodiment arrangement shown in FIG. 3(B) is beneficial because it facilitates the fabrication of SD-type memory cards using inexpensive TSOP memory devices, as explained in further detail below.

Figure 4:
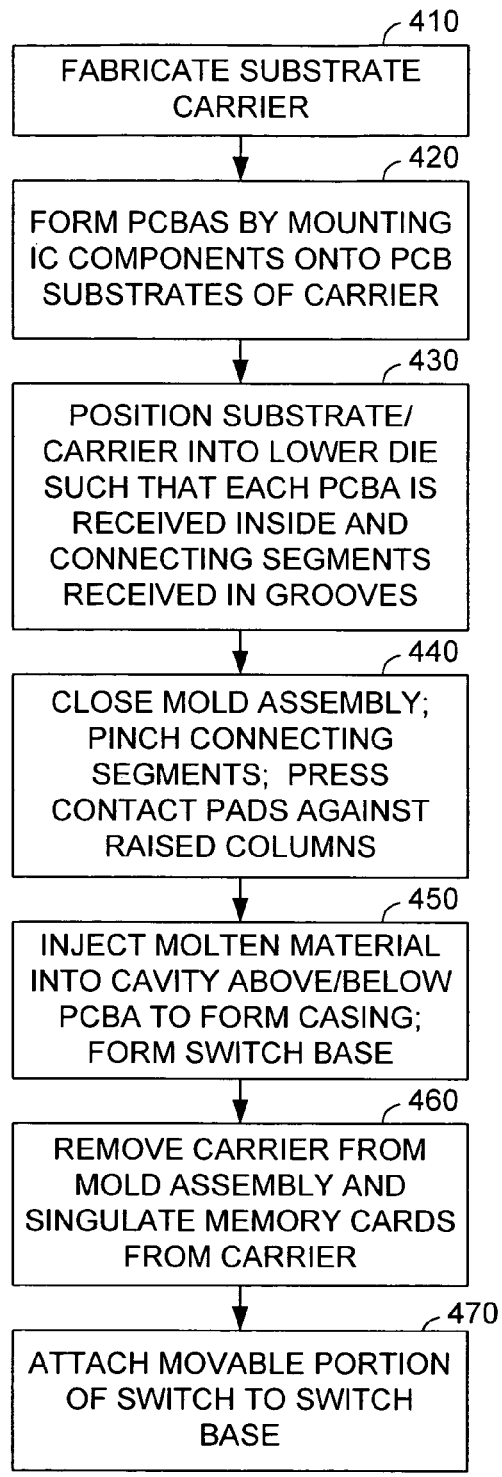
FIG. 4 is a flow diagram showing a memory card manufacturing method according to an embodiment of the present invention.

FIG. 4 is a flow diagram depicting a memory card manufacturing method according to a generalized embodiment of the present invention.

Referring to the upper portion of FIG. 4, the manufacturing process begins by forming a substrate carrier (block 410).

Figure 5A:
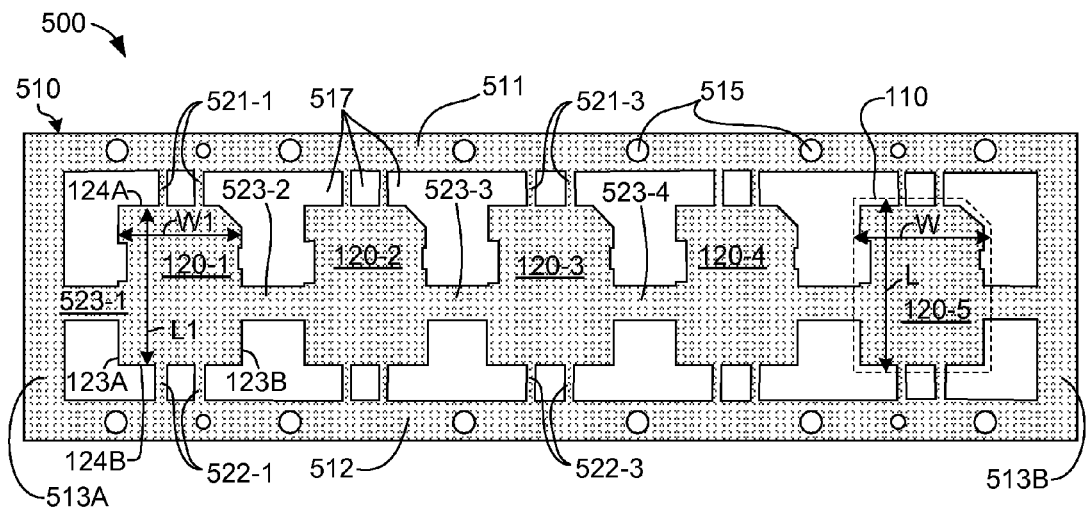
FIGS. 5(A) and 5(B) are perspective and top views showing an exemplary substrate carrier utilized in the production of memory cards according to an embodiment of the present invention.
Figure 5B:
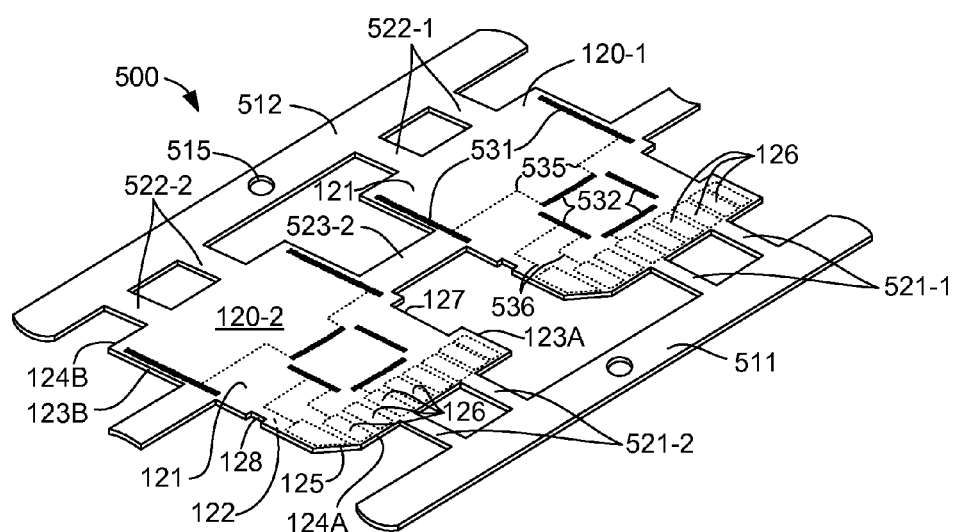

FIGS. 5(A) and 5(B) are top and partial perspective views showing an exemplary substrate carrier 500 formed in accordance with the present invention. In FIG. 5(A), shaded regions denote carrier material, and intervening non-shaded regions denote holes or openings. Carrier 500 includes parallel carrier strips 511 and 512 and a row of substantially rectangular printed circuit board (PCB) substrates 120 (e.g., substrates 120-1 through 120-5) mounted between carrier strips 511 and 512. Optional end strips 513A and 513B are mounted at the ends of the row of PCB substrates 120, and extend perpendicular to parallel carrier strips 511 and 512. Carrier strips 511 and 512 define indexing holes 515 that are used to properly position carrier 500 inside of a mold assembly, as discussed below.

According to an aspect of the present invention, each of edge of each PCB substrate 120 is connected by at least one connecting segment to a corresponding one of carrier strips 511 and 512, an adjacent PCB substrate, or an end strip 513A and 513B. For example, as indicated in FIG. 5(A), front edge 124A of PCB substrate 120-1 is connected to upper carrier strip 511 by a pair of (first) connector strips 521-1, rear edge 124B of PCB substrate 120-1 is connected to lower carrier strip 512 by a pair of (second) connector strips 522-1, side edge 123A of PCB substrate 120-1 is connected to end strip 513A by a (third) connector strip 523-1, and side edge 123B of PCB substrate 120-1 is connected to PCB substrate 120-2 by a (third) connector strip 523-2. Similarly, PCB substrate 120-3 is connected to upper carrier strip 511 by a pair of (first) connector strips 521-3, to lower carrier strip 512 by a pair of (second) connector strips 522-3, to PCB substrate 120-2 by a (third) connector strip 523-3, and to PCB substrate 120-2 by a (third) connector strip 523-4. Note that connector strips 521-1 and 522-1 are elongated sections of carrier material that are substantially narrower than the width W1 of PCB substrate 120-1 (i.e., the distance between side edges 123A and 123B), and generally extend perpendicular to parallel carrier strips 511 and 512. Similarly, connector strips 523-1 and 523-2 are elongated sections of carrier material that are substantially narrower than the length L1 of PCB substrate 120-1 (i.e., the distance between front edge 124A and rear edge 124B), and generally extend perpendicular to parallel carrier strips 511 and 512.

As indicated at the right side of FIG. 5(A), each PCB substrate (e.g., PCB substrate 120-5) is slightly smaller than the molded casing 110 (indicated by dashed line) into which the PCB substrate is ultimately encased. Specifically, the width W1 of each PCB substrate (indicated in substrate 120-1) is slightly smaller than the width W of casing 110, and the length L1 of each PCB substrate (indicated in substrate 120-1) is slightly smaller than the length L of casing 110. This arrangement facilitates the formation of front, rear and side casing walls that cover the edges of each PCB substrate, thus durably and securely encasing the PCB substrate and its associated memory/control devices.

FIG. 5(B) shows PCB substrates 120-1 and 120-2 of carrier 500 in additional detail. Each PCB substrate 120 (e.g., PCB substrate 120-2) includes an upper surface 121, a lower surface 122, a front edge 124A, an opposing back edge 124B, and opposing first and second side edges 123A and 123B. A chamfer 125 is provided between front edge 124A and side edge 123B. Located on lower surface 122 adjacent to front edge 124A are nine metal contact pads 126 (shown in dashed lines). Side edge 123A defines a "switch" notch 127 that facilitates the formation of an optional switch structure, discussed in further detail below. Side edge 123B defines an "indicator" notch 128 that facilitates the engagement with sensing mechanisms located inside the slot when the flash memory card is properly inserted into the host device.

According to another aspect of the present invention, carrier strips 511 and 512, end strips 513A and 513B, connector strips 521, 522, and 523, and PCB substrates 120 are simultaneously and integrally formed using conventional printed circuit board (PCB) techniques. For example, carrier strips 511 and 512, connector strips 521-1 and 522-1, and substrate 120-1 are formed from multiple layers or an electrically insulating material, such as bismalemide-triazine, epoxy resins, or polyamide resins, with substrate 120-1 including copper traces extending between the layers according to known PCB fabrication techniques to provide predetermined electrical connections. For example, as indicated on PCB substrate 120-1 in FIG. 5(B), a first exposed contact pattern 531 and a second contact pattern 532 are provided on upper surface 121, with selected pads of contact pattern 531 connected to corresponding pads of contact pattern 532 by buried conductors 535 (two shown), and selected pads of contact pattern 532 connected to corresponding metal contact pads 126 by buried conductors 536. Those skilled in the art will recognize that only a few conductors are indicated for illustrative purposes, and that the pattern positions and arrangements may be selectively altered. Note that the number of layers and the thickness of each layer are also selected based on predetermined dimensions. For example, in the exemplary embodiment described herein, total substrate thickness is approximately 0.2 to 0.3 mm thick.

Referring again to FIG. 4, PCBAs are then formed by mounting various IC components onto the substrate of the carrier (block 420).

Figure 6A:
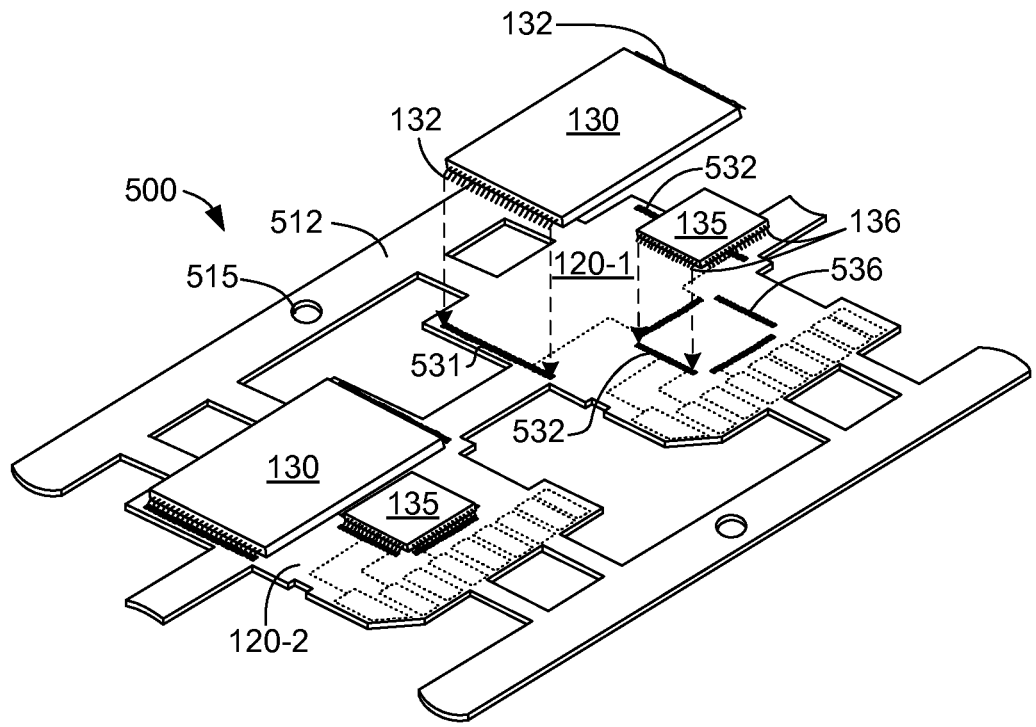
FIGS. 6(A) and 6(B) are partial perspective and top views depicting the assembly of IC components onto the substrate carrier of FIG. 5(A)
Figure 6B:
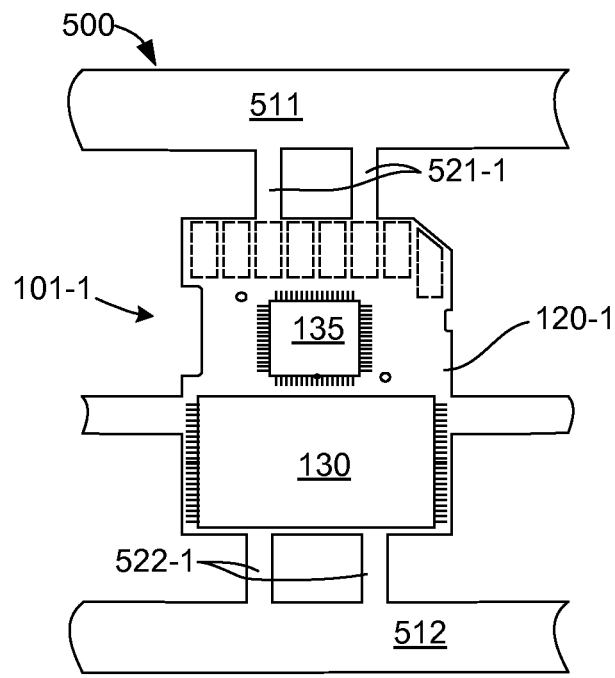

Referring to FIG. 6(A), in one embodiment, this mounting process involves passing carrier 500 (discussed above) through a solder dispensing machine (not shown) such that the solder paste is dispensed onto each pad of contact patterns 531 and 532 using known techniques. Next, carrier 500 is sent to an assembly machine (not shown) that utilizes indexing holes 515 or other markings to facilitate indexing (alignment) of the substrate regions into the designated location inside the assembly machine. Next, the various electrical components (e.g., memory device 130, control circuit 135, capacitors, resisters and other IC devices) are mounted onto each substrate 120 by the assembly machine. Next, substrate carrier 500 assembled substrate regions is passed through an oven (not shown) to reflow the solder paste such that the component is soldered to the substrate according to known techniques, thereby completing the production of PCBAs on each PCB substrate. FIG. 6(B) depicts a PCBA 101-1 formed on PCB substrate 120-1 at this stage of the manufacturing process (i.e., substrate 120-1, with memory device 130 and control circuit 135 mounted thereon, is still attached to the carrier strips 511 and 512 by way of the connecting segments 521-1 and 522-1, respectively.

Before further processing, carrier 500 may be subjected to an optional intermediate programming and test procedure. In one embodiment, this program/test procedure involves contacting probes to predetermined regions of each substrate region to power up and detect each memory card device, and then programming the detected memory card circuit, for example, by writing test data into the memory device. The programmed memory card circuit is then tested, for example, by reading the previously stored data and comparing with known good data. In one alternative embodiment, the tested memory card circuit is formatted, for example, by writing all binary "0" values into the memory device, and/or subjected to an identification writing process in which identification information is written into special memory locations of the memory card circuit.

Carrier 500 is then mounted onto the lower die of a multi-cavity mold assembly such that each PCBA is received inside a corresponding cavity of the mold assembly (block 430).

Figure 7A:
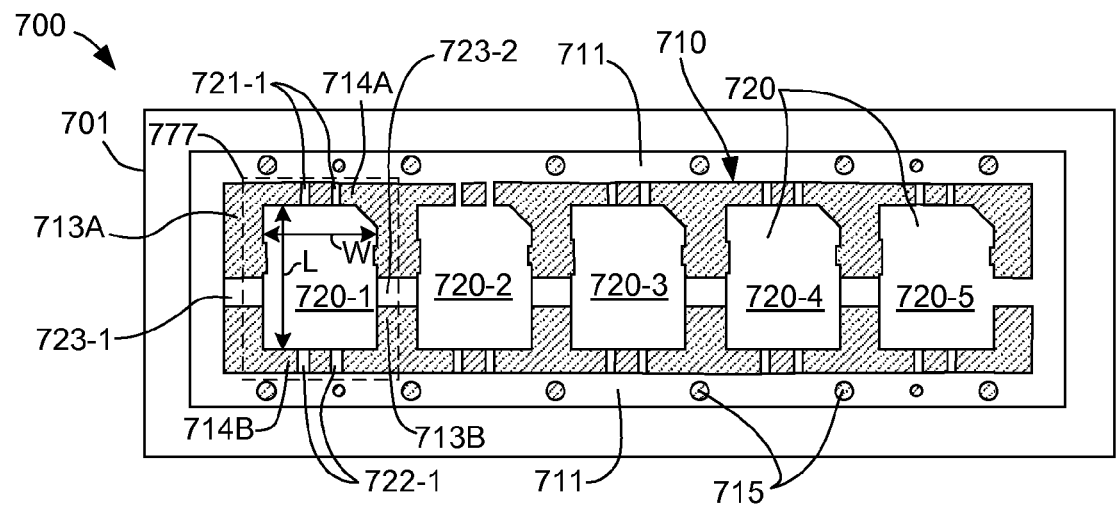
FIGS. 7(A) and 7(B) are top and partial perspective views depicting a portion of a mold assembly utilized in the production of memory cards according to an embodiment of the present invention.
Figure 7B:
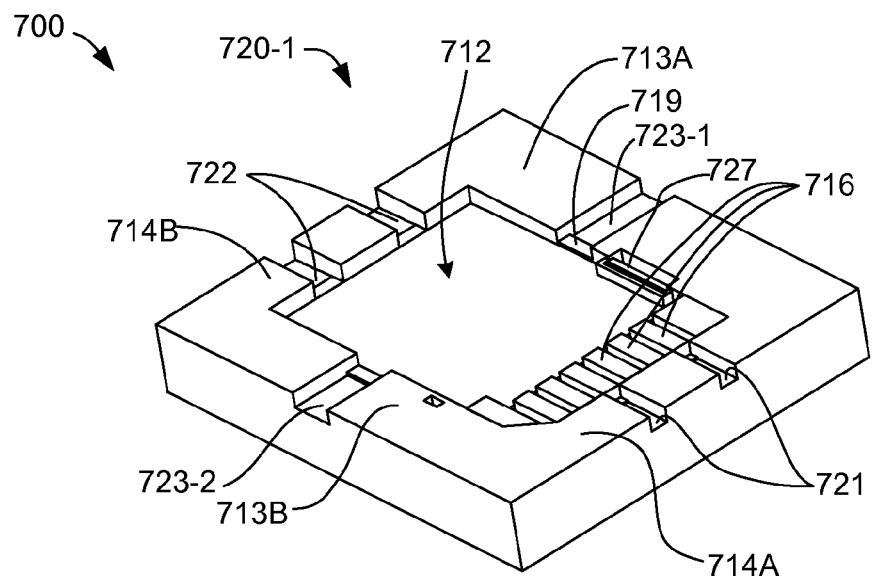

FIGS. 7(A) and 7(B) are top and partial perspective views showing the lower portion (die) 701 of an exemplary mold assembly 700 produced in accordance with the present invention. In FIG. 7(A), shaded regions denote a substantially planar upper surface of the die, and intervening non-shaded regions denote recessed surfaces. Lower portion 700 includes a peripheral land 711 surrounding a row of cavities 720 (e.g., cavities 720-1 through 720-5) that are defined by a raised wall structure 710. Peripheral land 711 includes indexing pins 715 that are used to properly position carrier 500 when mounted thereon, as discussed below.

The raised wall structure surrounding each cavity defines inside surfaces that are substantially equal to the memory card (e.g., SD card) size specifications. Specifically, the width W defined by side walls 713A and 713B, which define the side edges of cavity 720-1, is equal to the specified width dimension of the desired memory card. Similarly, the length L separating the inside surfaces of front wall 714A and rear wall 714B, which define the front and rear edges of cavity 720-1, is equal to the specified length dimension of the desired memory card.

According to an aspect of the present invention, each wall of each cavity 720 communicates by way of at least one groove either to peripheral land 711 or to an adjacent cavity. For example, as indicated in FIG. 7(A), front wall 714A of cavity 720-1 communicates with the uppermost portion of land 711 by a pair of (first) grooves 721-1, rear wall 714B of cavity 720-1 communicates with the lowermost portion of land 711 by a pair of (second) grooves 722-1, side wall 713A of cavity 720-1 communicates with the leftmost portion of land 711 by a (third) groove 723-1, and side wall 713B of cavity 720-1 communicates with cavity 720-2 by a (third) groove 723-2. Note that grooves 721-1 and 722-1 are sized to receive connector strips 521-1 and 522-1, respectively, when carrier 500 (discussed above) is mounted onto lower portion 701.

FIG. 7(B) shows a section of lower portion 701 of mold assembly 700 in additional detail. This section includes cavity 720-1, which is defined by a lower wall 712, a front wall 714A, an opposing back wall 714B, and opposing first and second side walls 713A and 713B. An angled chamfer wall portion extends between front wall 714A and side wall 713B. Located on lower surface 712 adjacent to front wall 714A are nine raised (platform-like) columns 716 that correspond with contact pads 126 of PCB substrate 120 (discussed above). These raised columns will be pinched against the contact pads as the PCBA is positioned in the cavity (discussed later), and prevent thermoplastic from molding over the contact pads, while facilitate the forming of ribs 117. Side wall 713A defines a switch structure 727 that facilitates the formation of a fixed portion of an optional switch structure, discussed in further detail below. Side wall 713B defines an "indicator" structure or notch (not shown) that facilitates the inclusion of an optional indicator light.

According to another aspect of the present invention, each groove formed in the walls surrounding each cavity includes a raised tip that is used to pinch a corresponding connecting segment during the molding process. For example, as best shown in FIG. 7(B), a raised tip 719 is formed at the inside edge of groove 723-1. Note that, as shown and described below, a corresponding tip formed on the upper die of the mold assembly 700 presses on the upper surface of a connecting segment (not shown) placed in groove 723-1 such that the connecting segment is pinched between the two tips. Note that FIG. 7(B) is for illustration purpose, and thus other mold features such as water cooling or air venting channels that are not necessary to explain the invention were not shown.

Figure 8A:
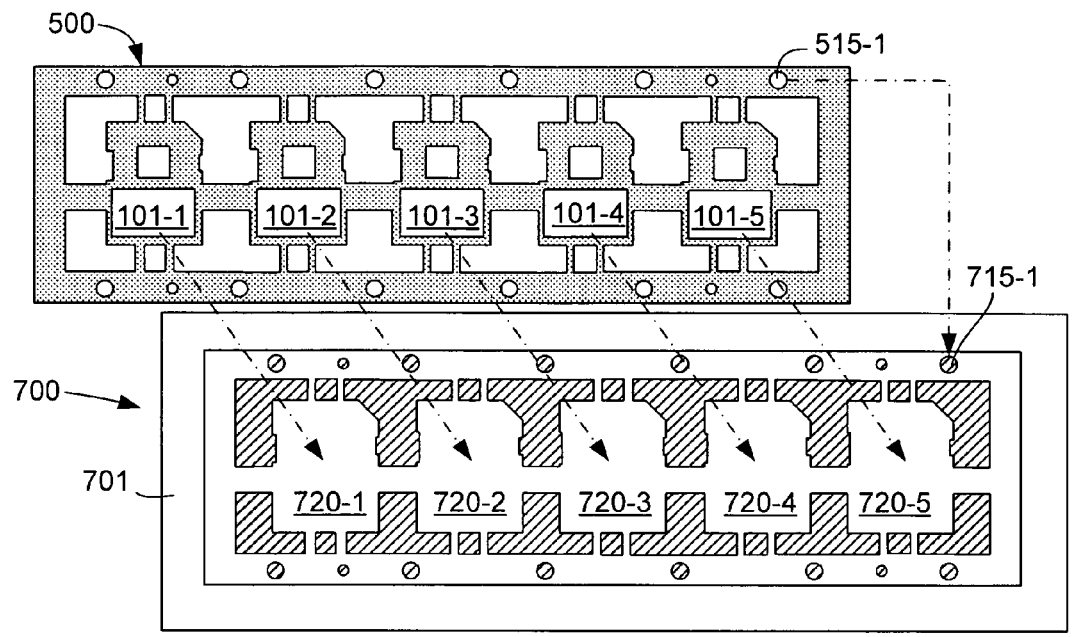
FIGS. 8(A) and 8(B) are exploded top and assembled top views depicting the carrier of FIG. 5(A) being mounted into the mold assembly of FIG. 7(A)
Figure 8B:
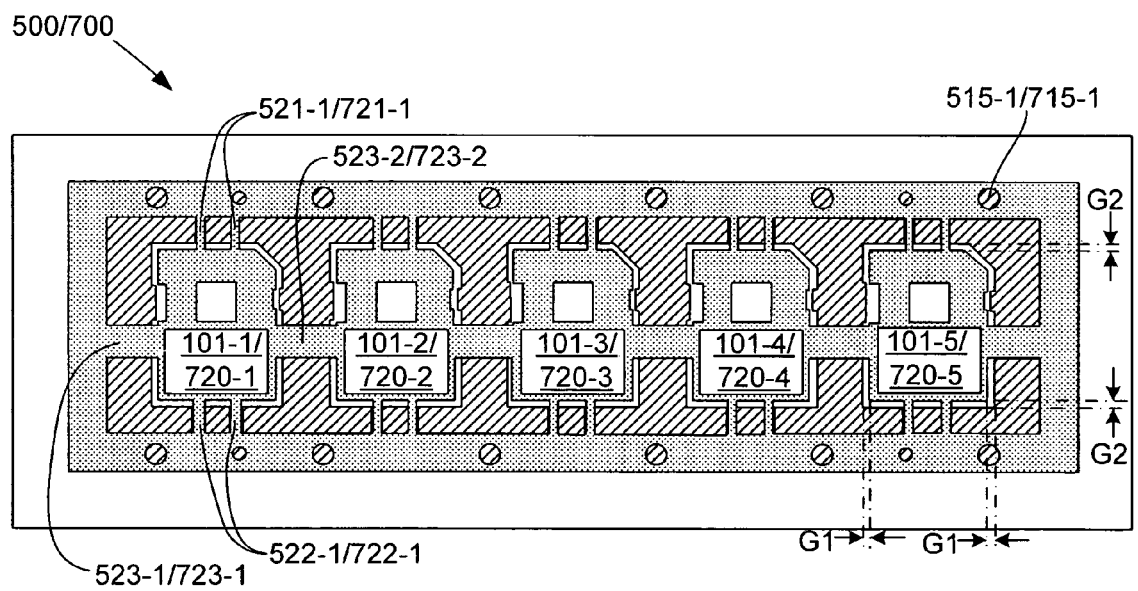

FIGS. 8(A) and 8(B) depict the process of mounting carrier 500 onto lower portion 701 of mold assembly 700 (both described above). As indicated in FIG. 8(A), carrier 500 is aligned with lower portion 701 such that indexing pin 715-1 of lower portion 701 receives corresponding indexing hole 515-1 of carrier 500, and such that each PCB substrate 120-1 through 120-5 is mounted into a corresponding cavity 720-1 through 720-5, respectively. As indicated in FIG. 8(B), when carrier 500 is mounted onto lower portion 701 of mold assembly 700 in this manner, each PCB substrate 120-1 through 120-5 is received in a corresponding cavity 720-1 through 720-5, respectively, such that the connecting segments extending from each PCB substrate extend out of the corresponding cavity through a corresponding groove. For example, connecting segments 521-1 of PCB substrate 120-1 are received in grooves 721-1 of lower portion 701, connecting segments 522-1 of PCB substrate 120-1 are received in grooves 722-1, connecting segment 523-1 of PCB substrate 120-1 is received in groove 723-1, and connecting segment 523-2, which connects PCB substrate 120-1 with PCB substrate 120-2, is received in groove 723-2.

As mentioned above, each PCB substrate 120 is sized such that a gap is formed between the substrates side edges and the insides cavity walls when carrier 500 is mounted onto mold assembly 700. For example, as indicated at the right side of FIG. 8(B), when PCBA 101-5 is received in cavity 720-5, first gaps G1 are defined between the side edges of PCBA 101-5 and the inside edges of the side walls defining cavity 720-5, respectively, and second gaps G2 are formed between the front and rear edges of PCBA 101-5 and the front and rear walls, respectively, defining cavity 720-5. These gaps are provided to facilitate the formation of the front, rear, and side walls of the molded casing.

Upon completing the carrier positioning process as described above, an upper (die) portion of the mold assembly is moved over and engaged with the lower platen such that each PCBA mounted on the carrier is enclosed in an associated cavity defined by the upper and lower platens (block 440).

FIG. 9 is a cross-sectional end view showing a portion of upper portion 702 of mold assembly 700 mounted onto lower portion 701 such that PCBA 101-1 is suspended inside cavity 720-1. Note that an upper cavity space 720U is defined between an upper surface of memory device 130 and an upper wall 711 of upper portion 702, and that a lower cavity space 720L is defined between a lower surface of PCB substrate 120 and lower wall 712 of lower portion 701. These cavity regions are filled by molten plastic in the subsequent molding process to form the upper and lower casing walls of the memory card. Note also that side connecting segments 523-1 and 523-2 respectively extend through grooves 723-1 and 723-2, but are pinched between corresponding tip structures formed on lower portion 701 and upper portion 702. For example, connecting segment 523-1 is pinched between a tip 719-1 extending upward from side wall 713-1 of lower portion 701 and a tip 749-1 extending downward from side wall 743-1 of upper portion 702. Similarly, connecting segment 523-2 is pinched between a tip 719-2 extending upward from side wall 713-2 of lower portion 701 and a tip 749-2 extending downward from side wall 743-2 of upper portion 702. By securely holding these connecting segments in this manner, PCB substrate 120 is reliably held in a desired (e.g., horizontal) position relative to mold assembly 700, thereby facilitating reliable and repeatable production of high quality SD-type memory cards.

FIGS. 10(A) and 10(B) are cross-sectional side views respectively showing portions mold assemblies 700-1 and 700-2 that are used to respectively produce memory cards 100-1 and 100-2, which are described above with reference to FIGS. 3(A) and 3(B), respectively.

FIG. 10(A) shows a mold assembly 700-1 used to produce memory cards 100-1 (FIG. 3(A)) in which PCB substrate 120 is suspended in a substantially flat (horizontal) orientation relative to mold assembly 700-1. Similar to the side connecting segments, the front and rear connecting segments 521 and 522 respectively extend through grooves 724A and 724B, and are pinched between corresponding tip structures in the manner described above. For example, connecting segment 522 is pinched between a tip 719-3 extending upward from rear wall 714B of lower portion 701-1 and a tip 749-3 extending downward from rear wall 744B of upper portion 702-1. Note that, in order to obtain the desired substantially flat orientation, both front connecting segment 521 and rear connecting segment 522 are suspended at the same height H relative to lower wall 712. Note that raised columns 716 press against contact pads 126 to prevent the formation of plastic on these structures during the subsequent molding process.

FIG. 10(B) shows a mold assembly 700-2 used to produce memory cards 100-2 (FIG. 3(B)) in which PCB substrate 120 is positioned in a bent arrangement such that a rear section 120B of PCB 120 defines a first plane P1, and such that a front section 120A of PCB 120 defines a second plane P2 that extends at an acute angle relative to plane P1. As indicated, this bent/angled orientation is achieved by suspending PCB 120 with connecting segment 521, which is pinched in groove 724A, maintained at a first height H1 relative to lower wall 712, and with connecting segment 522, which is pinched in groove 724B, maintained at a second height H2 relative to lower wall 712. By providing a bend (seam) 129 in PCB 120 at a selected location, and by selectively securing the side connecting segments (not shown) at proper heights relative to lower wall 712, the bent orientation shown in FIG. 10(B) can be reliably and repeatedly achieved. That is, the thin PCB material (about 0.3 mm in thickness) is flexible, and thus can accept a slight bending in unpopulated regions where no electronic component exists. This arrangement allows a less expensive Thin Small Outline Package (TSOP)-type of flash memory chip (1.1 mm in thickness) to be used while maintaining the front end of the PCB to be slightly tilted downward (away from ribs) to allow the PCB to be placed underneath the rib and maintain a 0.7 mm distance to the top surface as defined by the SD specifications. Without such a bend, a more expensive Very Very Thin Small Outline Package (WSOP)-type of flash memory will have to be used.

Referring again to FIG. 4, after the PCBA is precisely positioned inside of the mold assembly and the mold assembly is closed as shown in FIG. 9 and FIG. 10(A) or 10(B), molten molding material is injected into the mold cavity regions defined above and below each PCBA under heat and pressure using known injection molding techniques, and onto switch structure 727 (FIG. 7(B)) to form a switch base (block 450).

After an appropriate cooling down period, the carrier is removed from the mold assembly, and then the individual memory cards are singulated (block 460).

Figure 11:
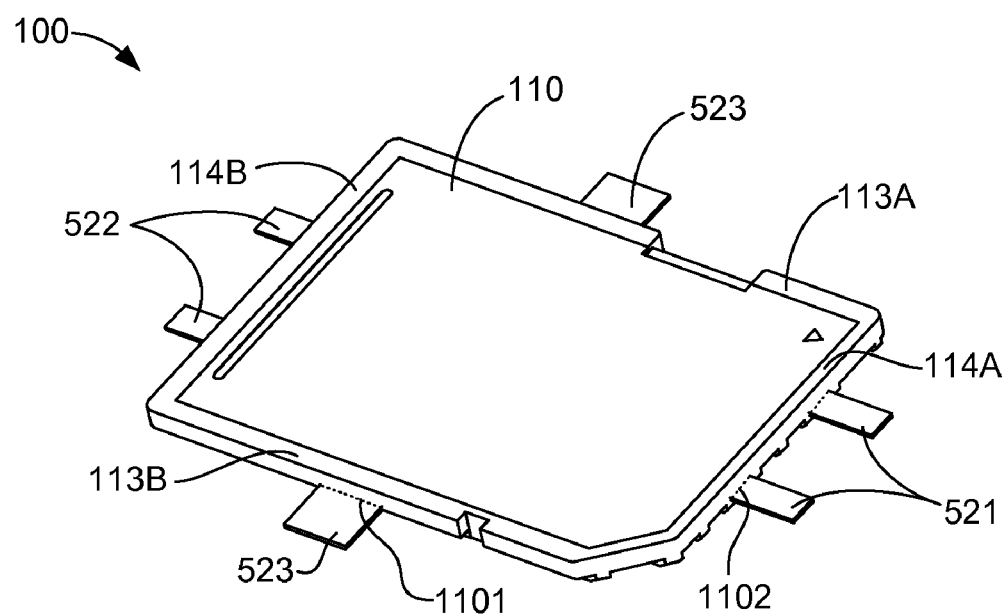
FIG. 11 is a perspective view depicting a substantially completed memory card with connecting segments still attached after being removed from the mold assembly of FIG. 9.
Figure 12:
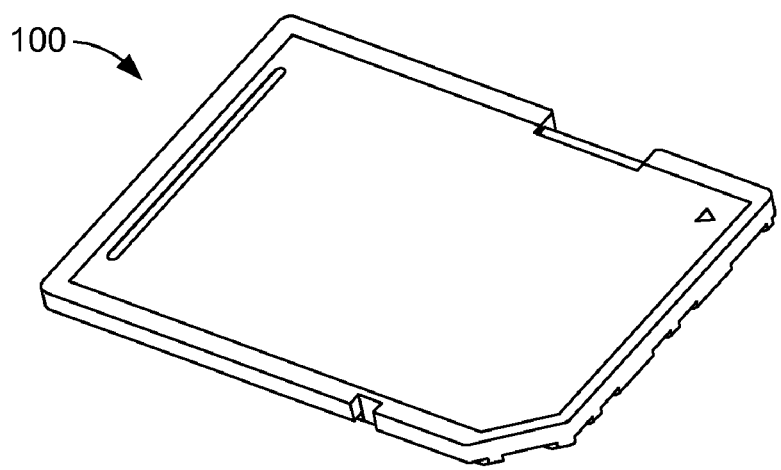
FIG. 12 is a perspective view depicting a completed memory card after singulation.

FIGS. 11 and 12 show an exemplary memory card 100 upon removal from the mold assembly and after subsequent singulation. Referring to FIG. 11, when removed from the mold assembly and still attached to the carrier, connecting segments 521, 522 and 523 extending from front wall 114A, back wall 114B, and side walls 113A and 113B of molded casing 110, respectively (note that other portions of the carrier are not shown for clarity). Dashed lines 1101 and 1102 indicate cut lines where connecting segments 521, 522 and 523 are severed utilizing a cutter (not shown) according to known practices. FIG. 12 shows the singulated memory card 100-1.

Returning to FIG. 4, after singulation, the movable portion of an optional write-protect switch is slidably attached onto the corresponding molded switch base of each memory card (block 470). Note that in some embodiments the write-protect switch may be omitted, thus simplifying the mold assembly by obviating the need for switch structure 727 (FIG. 7(B)) used to form the switch base, and simplifying the production process by eliminating the need for mounting the movable switch portion. Note also that the process of attaching the movable portion may be performed prior to singulation.

FIG. 13 shows the mold construction to accommodate an insertion-type write-protect switch structure 150-1, along with a corresponding portion of a cavity to be filled by the thermoplastic to form side wall 113A-1. This arrangement will produce a cavity after molding to receive the switch structure 150-1 according to an embodiment of the present invention. Insert 150-1 generally includes a base (fixed) portion 151-1 embodied by an elongated channel 153-1 defined in side wall 113A-1, and a movable portion 155-1 that is slidably engaged into elongated channel 153-1. Channel 153-1 includes a lower channel portion 153-1A and an upper channel portion 153-1B. Movable insert 155-1 includes a lower movable member 155-1A, an upper movable member 155-1B, and a shim 155-1C. Lower movable member 155-1A includes a lower rail portion 156-1A and a lower handle portion 157-1A, and upper movable member 155-1B includes an upper rail portion 156-1B and an upper handle portion 157-1B. After molding, a cavity excavated by the insert 155-1 is formed in the mold assembly and the three insert pieces 155-1A, 155-1B and 155-1C are removed. The shim 155-1C is removed first, creating a space between lower movable member 155-1A and upper movable member 155-1B. One of the moveable members is removed from the cavity next. Note that some rotation of the moveable member inside the cavity is needed in order to remove the moveable member. The remaining moveable member is finally removed from the cavity. A separately molded switch having a shape of the combined external of moveable members 155-1A, 155-1B and 155-1C is then inserted into the just emptied cavity.

FIG. 14 shows a mounting-type write-protect switch structure 150-2, along with a corresponding portion of a side wall 113A-2, that is mounted according to another embodiment of the present invention. Switch 150-2 generally includes a base (fixed) portion 151-2 embodied by an elongated rail 153-2 defined by a portion of side wall 113A-2, and a movable portion 155-2 that defines an elongated opening 156-2 and has a handle portion 157-2 that extends from side wall 113A-2. An opening 158-2 is defined along elongated opening 156-2 to facilitate snap-coupling movable portion 155-2 onto fixed portion 151-2 such that movable portion 155-2 is slidably engaged on elongated rail 153-2.

Although the present invention has been described with respect to certain other specific embodiments, it will be clear to those skilled in the art that the inventive features of the present invention are applicable to other embodiments as well, all of which are intended to fall within the scope of the present invention. For example, FIG. 15 shows an alternative carrier 1500 in which PCB substrates 120-11 through 120-15 are transposed 90°☐ from the arrangement described above. That is, PCB substrates 120-11 through 120-15 are arranged such that parallel carrier strips 1511 and 1512 are connected to the side edges of each PCB substrate (i.e., instead of the front/rear edges, as in carrier 500 discussed above). For example, PCB substrate 120-11 includes a first side edge 123A connected to a first carrier strip 1511 by a first connecting segment 1521, and a second side edge 123B that is connected to a second carrier strip 1512 by a second connecting segment 1522. In addition, the front and rear edges of each PCB substrate are connected either to an end carrier strip or to an adjacent PCB substrate by way of third connecting segments. For example, a front edge 124A of PCB substrate 120-11 is connected to end carrier strip 1515A by connecting segment 1523-1, and a rear edge 124B of PCB substrate 120-11 is connected to PCB substrate 120-12 by connecting segment 1523-2. Those skilled in the art will recognize that numerous alternative switch structures may be utilized in place of be specific switch structures discussed above without changing the spirit and scope of the present invention.

The invention claimed is:

1. A method for fabricating a memory card, the method comprising:
    forming a first printed circuit board assembly (PCBA) including a substantially rectangular printed circuit board (PCB) substrate having opposing upper and lower surfaces, opposing front and back edges and opposing first and second side edges extending between the front and back edges, and a plurality of connecting segments integrally formed with the PCB substrate, each connecting segment extending perpendicular to an associated one of the front edge, the back edge, the first side edge, and the second side edge;
    positioning the first PCBA into a cavity of a mold assembly such that each of the connecting segments is received in a corresponding groove formed in side walls surrounding the cavity, and such that when the mold assembly is closed the first PCBA is suspended inside of the cavity; and
    injecting molten plastic into the cavity such that a plastic casing is formed on the upper and lower surfaces of the first PCBA.

2. The method according to claim 1, wherein forming the first PCBA comprises forming a carrier including first and second parallel carrier strips such that the PCB substrate is connected to the first carrier strip by a first connecting segment of said plurality of connecting segments, and such that the PCB is connected to the second carrier strip by a second connecting segment of said plurality of connecting segments.

3. The method according to claim 2, wherein forming the carrier comprises forming a second PCBA connected to the first and second parallel carrier strips by third and fourth connecting segments, and connected to the first PCBA by a third connecting segment of said plurality of connecting segments.

4. The method according to claim 2, wherein forming the carrier further comprises arranging the PCB substrate such that the front edge of the PCB substrate is connected to the first carrier strip by the first connecting segment, and the back edge is connected to the second carrier strip by the second connecting segment.

5. The method according to claim 4, wherein forming the carrier comprises forming a second PCBA having a side edge connected to the first side edge of the first PCB substrate by a third connecting segment of said plurality of connecting segments, wherein the second PCBA further includes front and back edges respectively connected to the first and second parallel carrier strips by fourth and fifth connecting segments.

6. The method according to claim 2, wherein forming the carrier further comprises arranging the PCB substrate such that the first side edge of the PCB substrate is connected to the first carrier strip by the first connecting segment, and the second side edge is connected to the second carrier strip by the second connecting segment.

7. The method according to claim 6, wherein forming the carrier further comprises forming a second PCBA having a front edge connected to the back edge of the first PCB substrate by a third connecting segment of said plurality of connecting segments, wherein the second PCBA further includes first and second side edges respectively connected to the first and second parallel carrier strips by fourth and fifth connecting segments.

8. The method according to claim 2,
    wherein forming the carrier further comprises forming indexing holes in the first and second carrier strips, and
    wherein positioning the first PCBA into the cavity further comprises mounting the alignment holes over alignment pins formed on the mold assembly.

9. The method according to claim 1, wherein forming the first PCBA further comprises mounting one or more integrated circuits on the PCB substrate.

10. The method according to claim 1,
    wherein the first and second side edges of the PCB substrate are separated by a first distance and the front wall separated from the back wall by a second distance, and
    wherein the method further comprises forming said mold assembly such that the cavity is defined by opposing first and second side walls separated by a third distance that is greater than the first distance such that first gaps are formed between the first and second side edges and the first and second side walls, respectively, and such that said cavity is defined by opposing front and rear walls separated by a fourth distance that is greater than the second distance such that second gaps are formed between the front and rear edges and the front and rear walls, respectively.

11. The method according to claim 1, wherein positioning the first PCBA into a cavity comprises suspending the first PCBA such that the PCB substrate is substantially flat along its entire length.

12. The method according to claim 1, wherein positioning the first PCBA into a cavity comprises suspending the first PCBA such that a rear section of the PCB substrate defines a first plane, and such that a front section of the PCB substrate defines a second plane that extends at an acute angle relative to the first plane.

13. The method according to claim 12, wherein suspending the first PCBA comprises maintaining a first connecting segment connected to the front edge of the PCB substrate at a first height relative to a lower surface of the cavity, and maintaining a second connecting segment connected to the rear edge of the PCB substrate at a second height relative to the lower surface of the cavity, wherein the first height is greater than the second height.

14. The method according to claim 1, further comprising:
removing the PCBA from the mold assembly; and
removing the connecting segments from front, rear, and first and second side edges of the plastic casing.

15. The method according to claim 1,
wherein injecting the molten plastic comprises forming a switch base on a side wall of the casing, and
wherein the method further comprising attaching a movable switch portion to the switch base.

16. The method according to claim 15,
wherein forming the switch base comprises forming an elongated channel by mounting an insert including a lower member having a lower rail portion and a lower handle portion, an upper member including an upper rail portion and an upper handle portion and a shim positioned between the lower and upper members into the mold assembly, injecting the molten plastic over the upper and lower rail portions to form the elongated channel, and then removing the insert by first removing the shim, and then removing the upper and lower members, and
wherein attaching the movable switch portion to the switch base comprises mounting the movable switch portion such that an elongated rail of the movable switch portion is slidably received inside the elongated channel, and a handle portion of the movable switch portion extends from the elongated channel.

17. The method according to claim 15,
wherein forming the switch base comprises forming an elongated rail, and
wherein attaching the movable switch portion to the switch base comprises mounting the movable switch portion such that the elongated rail of the switch base is slidably received inside an elongated opening defined in the movable switch portion.

18. The method according to claim 1, wherein the memory card is a Secure Digital (SD) memory card.

19. A method for fabricating a memory card, the method comprising:
forming a carrier including:
first and second parallel carrier strips,
a row of substantially rectangular printed circuit board (PCB) substrates mounted between the first and second carrier strips, each PCB substrate having opposing front and back edges and opposing side edges extending between the front and back edges, a plurality of metal contact pads formed adjacent to the front edge, and
a plurality of first connecting segments, each first connecting segment extending between the front edge of an associated PCB substrate and the first carrier strip,
a plurality of second connecting segments, each second connecting segment extending between the back edge of an associated PCB substrate and the second carrier strip, and
one or more third connecting strips extending between a first side edge of an associated first PCB substrate and a second side edge of a second associated PCB substrate;
mounting one or more integrated circuits on each of the PCB substrates;
positioning the carrier into mold assembly such that each PCB substrate is received in a corresponding cavity of the mold assembly, and such that each of the first, second, and third connecting segments extending from said each PCB substrate is received in a corresponding groove formed in side walls surrounding the corresponding cavity;
closing the mold assembly such that each of the first, second, and third connecting segments extending from said each PCB substrate are pinched between upper and lower portions of the mold assembly, thereby suspending said each PCB substrate inside of the corresponding cavity; and
injecting molten plastic into each of the plurality of cavities such that a plastic casing is formed over the integrated circuits mounted on each of the PCBs.

* * * * *